United States Patent [19]

Larsen

[11] Patent Number: 5,621,323
[45] Date of Patent: Apr. 15, 1997

[54] SURFACE COIL ELEMENTS

[75] Inventor: Sanford Larsen, Provo, Utah

[73] Assignee: Magnetic Research, Inc., Mapleton, Utah

[21] Appl. No.: 489,792

[22] Filed: Jun. 13, 1995

Related U.S. Application Data

[63] Continuation of Ser. No. 800,496, Nov. 29, 1991, abandoned.

[51] Int. Cl.$^6$ .................................................. G01R 33/20
[52] U.S. Cl. ........................................ 324/318; 324/322
[58] Field of Search ........................................ 324/318, 322, 324/300; 128/653.2, 653.5

[56] References Cited

U.S. PATENT DOCUMENTS

| | | | |
|---|---|---|---|
| 4,126,823 | 11/1978 | Dalton, Jr. | 324/301 |
| 4,408,162 | 10/1983 | Egger | 324/318 |
| 4,564,812 | 1/1986 | Van Dijk | 324/318 |
| 4,620,155 | 10/1986 | Edelstein | 324/318 |
| 4,684,895 | 8/1987 | Misic | 324/322 |
| 4,717,881 | 1/1988 | Flugan | 324/318 |
| 4,728,896 | 3/1988 | Bendall et al. | 324/318 |
| 4,739,271 | 4/1988 | Haase | 324/322 |
| 4,782,298 | 11/1988 | Arakawa et al. | 324/318 |
| 4,788,503 | 11/1988 | Va Heelsbergen | 324/322 |
| 4,801,885 | 1/1989 | Meissner | 324/318 |
| 4,839,594 | 6/1989 | Misic et al. | 324/318 |
| 4,855,680 | 8/1989 | Arakawa et al. | 324/322 |
| 4,866,387 | 9/1989 | Hyde | 324/318 |
| 4,974,113 | 11/1990 | Gabrielge et al. | 324/320 |
| 5,136,244 | 8/1992 | Jones et al. | 324/318 |
| 5,144,240 | 9/1992 | Mehdizadeh et al. | 324/322 |
| 5,166,618 | 11/1992 | Jones et al. | 324/318 |
| 5,256,971 | 10/1993 | Boskamp | 324/318 |
| 5,256,972 | 10/1993 | Keren et al. | 324/318 |
| 5,278,505 | 1/1994 | Arakawa | 324/322 |

*Primary Examiner*—Walter E. Snow
*Assistant Examiner*—Raymond Y. Mah
*Attorney, Agent, or Firm*—I. Morley Drucker; Howard N. Sommers; Daniel R. Kimbell

[57] ABSTRACT

A coil element, comprising a quadrature surface coil, includes side by side loops, slightly overlapped to the degree necessary to cancel mutual inductance. A coil includes a split-capacitor configuration for balanced-to-unbalanced conversion between the coil and a coaxial cable, without interfering with the highly magnetic environment of a magnetic resonance imaging system. A coil includes multiple diodes and current stabilizing impedances in parallel, or alternatively a combination of a fast low-power PIN diode and a slow high-power diode to effectively multiply the power handling capability of fast diodes for passive decoupling in a decoupling circuit for reducing the risk to the patient over active decoupling. A coil includes a counter-rotating decoupling circuit to cancel the effects of decoupler radiation, and to prevent lowering of the quality factor of the decoupling circuit and the detection of undesirable image artifacts. A coil includes a capacitor and decoupling circuit opposite that of the primary tuning and decoupling circuit for increased symmetry during the imaging cycle receive and transmit phases.

19 Claims, 3 Drawing Sheets

SURFACE COIL ELEMENTS

This application is a continuation of application Ser. No. 07/800,496, filed Nov. 29, 1991, now abandoned.

BACKGROUND OF THE INVENTION

The invention relates generally to a surface coil element. It relates specifically to a quadrature surface coil adapted for use in a magnetic resonance imaging system.

It has been known that signal-to-noise ratio gains can be achieved by providing a quadrature surface coil which consists of a loop and a figure-eight, or butterfly, loop. The symmetry of the configuration of the quadrature surface coil results in the loops experiencing substantially zero mutual inductance, an important property in quadrature technology.

However, planar surface coils of this symmetrical quadrature configuration do not provide significant gains in signal-to-noise ratio.

It has been further known that the loop antenna used in coils is intrinsically a balanced structure, whereas the coaxial cable that transports the signal to the magnetic resonance imaging signal processor is adapted to function in an unbalanced manner, resulting in signal loss.

To minimize signal loss, it is desirable to make the proper balanced-to-unbalanced conversion between the coil and the coaxial cable. It has been known to perform this function with a circuit known as a balun. Baluns are typically constructed from loops of wire in either a transformer or split-inductor configuration.

However, baluns are known to be bulky and may require a finite core, which interferes with the highly magnetic environment of a magnetic resonance imaging system.

It has been further known to decouple a surface coil from the volume transmit coil, where the volume of the coil may comprise the head or body of the patient, while the volume coil is transmitting radio frequency pulses.

Decoupling is needed because many surface coils are designed to be in resonance at the precise frequency of transmission, which poses a serious health hazard to the patient, in that resonance effectively focuses the transmitted radio frequency energy onto a small area of patient tissue, causing a burn.

Further, decoupling is needed in that the surface coil will distort the transmitted radio frequency pulse, thereby causing inhomogeneities in the magnetic resonance image.

Decoupling of the surface coil from the volume coil is known to be best effected by including a decoupling circuit designed to open the loop during the radio frequency pulse.

Decoupling circuits are known to include high speed PIN diodes as the switching element because of their excellent radio frequency properties and their power handling capabilities. They are used in conjunction with inductors, capacitors, and/or quarter wavelength sections of transmission lines to open the circuit properly.

The known methods of switching PIN diodes on and off in decoupling circuits are active decoupling and passive decoupling.

Active decoupling uses a relatively small direct current bias provided by the magnetic resonance imaging signal processor to switch the diode, and is easy to implement. Passive decoupling uses the current induced in the loop by the radio frequency pulse to switch the diode, and is intrinsically safer in practice than active decoupling.

However, active decoupling results in a substantial risk to the patient, since many electrical components and interconnects are involved, any of which may fail.

Active decoupling uses PIN diodes having a large intrinsic region (I) between the P and N regions. The intrinsic region accumulates charge from the direct current bias, effectively allowing the small direct current bias to switch a much higher radio frequency current in the decoupling circuit.

However, while such a PIN diode works well in active decoupling, it is much too slow when used in passive decoupling. It requires a much higher turn-on voltage than is available in many surface coil applications, resulting in sub-optimal decoupling or no decoupling, with consequential potential harm to the patient.

A much faster PIN diode is required for passive decoupling, which calls for a diode having a much smaller intrinsic region than that used in active decoupling.

However, a smaller intrinsic region in the faster PIN diode results in significantly lower power handling capability.

Decoupling circuits are further known to have a large level of radio frequency current flowing through a tuned inductor-capacitor circuit, causing substantial radio frequency energy to radiate from the circuit.

However, since surface coils are positioned very close to the patient's tissue, the radiated energy is absorbed by the patient's tissue. This lowers the quality (Q) factor of the decoupler, thus lowering its performance, and can also result in undesirable image artifacts in the region that is absorbing the radiated radio frequency.

It has been further known that capacitive coupling occurs between the loop of the coil and the patient's tissue, since surface coils are placed so close to the patient. This results in an asymmetrical coil design that may produce undesirable inhomogeneities in the magnetic resonance image.

To minimize the effect of capacitive coupling, it has been known to use a Faraday shield around the loop to prevent or equalize the capacitive coupling to the patient, or multiple capacitors spaced evenly around the loop to minimize the effect of the capacitive coupling.

However, such known methods of minimizing the effect of capacitive coupling present technical difficulties, and result in a coil design that is more symmetrical during the receive phase of the imaging cycle, when the loop is closed, but not during the transmission phase, when the loop is opened by the decoupling circuit.

It is still further known in the art that there exists an optimal loop size and shape that maximizes the signal-to-noise ratio for a given region-of-interest that is a specific size, shape, and depth from the surface coil, and for a known precise source of noise in the magnetic resonance imaging system.

The optimal loop size and shape is such that making the size either smaller or larger and/or changing the shape or position will result in a lower signal-to-noise ratio.

For example, if the region of interest is very small and the source of noise is primarily thermal noise from the loop's radiation resistance, the optimal loop will be round in shape, while making the loop square will result in a slightly reduced signal-to-noise ratio. Further, if other sources of noise are also significant, the optimal loop size may vary to some degree, depending on the relative strengths of each noise source.

Many applications require images of regions that extend beyond the radius of the optimal loop size. A prime example is the thoracic region of the spine, in which case an oversized rectangular loop would be more suitable than a smaller round or square loop.

A larger loop having a lower signal-to-noise ratio, is known to be used for imaging a region that is larger than the optimal loop size. For example, for the case of the thoracic spine, it is known to use a rectangular loop that is about twice as long as it is wide, with a resulting signal-to-noise ratio loss of nearly six decibels compared to that of a square coil covering half the length.

An array of loops is known to be used to achieve the benefits of both maximal signal-to-noise ratio and sufficient coverage.

However, an array of loops, while technically feasible, requires multiple processors and elaborate digital processing to correctly reconstruct the image from the multiple loops, resulting in more expensive future systems, and not benefiting presently installed magnetic resonance imaging systems.

SUMMARY OF THE INVENTION

The quadrature surface coil of the invention is adapted to overcome the above problems, as well as others, associated with known quadrature surface coils and also linear coils.

The coil of the invention may be a linear coil or a quadrature coil. The quadrature surface coil is adapted to provide quadrature detection, which achieves quadrature and increases the area of coverage without loss of signal-to-noise ratio, and which cancels highly undesirable mutual inductance.

It includes two loops placed side by side, which are slightly overlapped to the degree necessary to cancel the mutual inductance.

The coil of the invention is further adapted to provide balanced-to-unbalanced conversion between the coil and the coaxial cable, which minimizes signal loss, without bulky elements and finite cores which interfere with the highly magnetic environment of a magnetic resonance imaging system.

It includes a split-capacitor configuration, without bulky elements and finite cores.

The coil of the invention is adapted to increase the power handling capacity of fast diodes used in a decoupling circuit, for effective passive decoupling which reduces the risk to the patient over active decoupling.

It includes multiple diodes and current stabilizing impedances in parallel to effectively multiply the power handling capability of fast PIN diodes. Alternatively, it includes a combination of a fast low-power diode and a slow high-power PIN diode having a large intrinsic region to also effectively multiply the power handling capability of fast diodes. It may also alternatively include a PIN diode and a detector diode.

The coil of the invention is adapted to cancel the effects of radiation of energy from the large level of radio frequency current flowing through the decoupling circuit, otherwise absorbed by the patient's tissue, which would lower the quality factor of the decoupling circuit and result in undesirable image artifacts.

In includes a counter-rotating decoupler circuit to cancel the effects of radiation, and may further include a Faraday shield to prevent radiation from the decoupling circuit.

The coil of the invention is further adapted to be more symmetrical during both the receive and transmit phases of the imaging cycle, so as to prevent undesirable inhomogeneities in the magnetic resonance image.

It includes a capacitor and decoupling circuit opposite that of the primary tuning and decoupling circuits, for increased symmetry during the imaging cycle receive and transmit phases.

The coil of the invention is adapted to provide an array of loops for effective signal-to-noise ratio and sufficient coverage for imaging a region of interest larger than the optimal loop size.

It includes an array of two or more loops, linear or quadrature, without any additional hardware or software to reconstruct the image, for effective signal-to-noise ratio and sufficient imaging coverage.

DESCRIPTION OF THE PREFERRED EMBODIMENTS

The coil of the invention may comprise a quadrature surface coil 10, or other coils, such as linear coils or arrays of coils. The quadrature surface coil 10 of the invention, in the preferred embodiments shown in FIGS. 2-5 and described below, with a prior art form thereof shown in FIG. 1 and described below, are adapted to interact with the receiving and transmitting phases of the imaging cycle in a magnetic resonance imaging device to provide accurate images of the region of interest in a patient.

Figure 1:
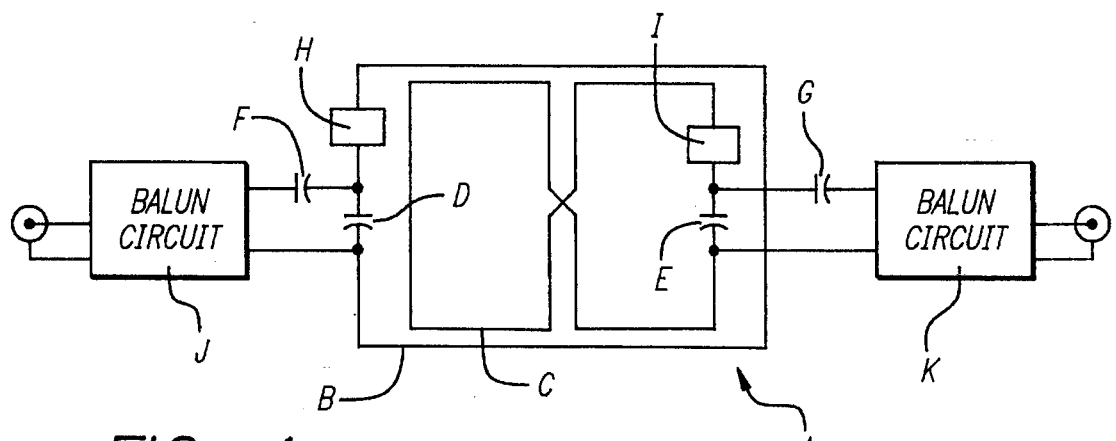
FIG. 1 is a circuit diagram of a prior art quadrature surface coil.

A typical prior art surface coil A, as shown in FIG. 1, is used in a quadrature configuration, shown, and a linear configuration, not shown. A linear coil would omit one of the two loops B, C.

Quadrature coil A typically consists of a simple loop B, and a figure-eight or butterfly loop C. Either of the loops B, C may be contoured around the region of interest in the patient.

Quadrature coil A further includes tuning capacitors D, E, matching capacitors F, G, and decoupling circuits H and I, and may further include balun circuits J and K.

Because of the symmetry of the design in quadrature coil A, the two loops B, C experience virtually zero mutual inductance.

This configuration works well in many applications; however, it loses its effectiveness in others. For example, planar surface coils do not provide substantial gains in signal-to-noise ratio.

Figure 2:
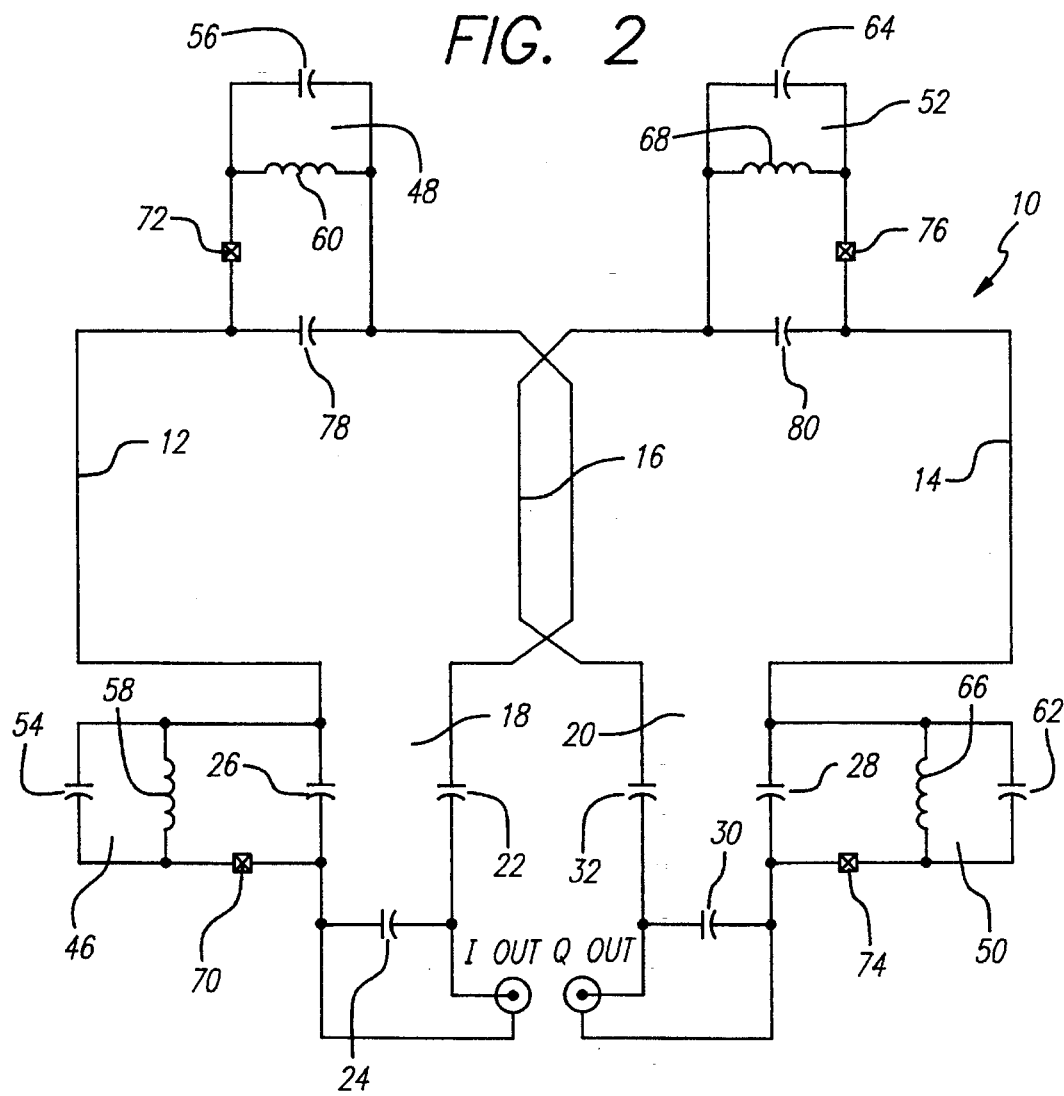
FIG. 2 is a circuit diagram of a quadrature surface coil, pursuant to the invention.

The quadrature surface coil 10 of the invention, as shown in FIG. 2, incorporates two loops 12, 14 side-by-side to provide quadrature detection. In planar constructions, this configuration achieves quadrature, and increases the area of coverage without loss of signal-to-noise ratio. In non-planar constructions, signal-to-noise ratio gains are achieved as well.

Typically, such a configuration would be plagued by highly undesirable mutual inductance between the two loops.

However, in the invention, the loops 12, 14 are overlapped, at 16, to cancel mutual inductance.

Whenever two conductive loops, as 12, 14 are placed near each other, any alternating current-flow in one of the loops will induce a current flow in the other, since magnetic flux lines couple the loops.

The closer the two loops are relative to each other the greater the magnetic coupling.

If the loops overlap, they will also couple with opposite polarity.

In the invention, when the degree of overlap, as at 16 in FIG. 2, is carefully calibrated, the positive and negative couplings can be made to exactly cancel, effectively decoupling the loops from one another.

The quadrature surface coil 10 of the invention includes the loop overlapping portion 16, adapted to cancel the magnetic coupling and effectively decouple the loops 12, 14.

The quadrature loop pair 12, 14 will produce quadrature effect within a limited volume near the overlapped portion when configured in a planar structure.

The volume of quadrature effect is greatly increased in a variation of the invention to form a concave shape, with overlapped portion 16 comprising the axis of curvature. Alternately, the loops may be angled to form a generally "V" shape. This dual-loop configuration achieves quadrature, and also increases the signal-to-noise ratio.

The quadrature surface coil 10 of the invention provides quadrature detection which achieves quadrature and increases the area of coverage without loss of signal-to-noise ratio, and which cancels highly undesirable mutual inductance.

Loops 12, 14 placed side by side are slightly overlapped to the degree necessary to cancel the mutual inductance.

A coil 10, such as a linear or other coil, in another embodiment of the invention, provides balanced-to-unbalanced conversion between the coil and the coaxial cable, which minimizes signal loss, without bulky elements and ferrite cores which interfere with the highly magnetic environment of a magnetic resonance imaging system.

It includes a split-capacitor configuration, without bulky elements and ferrite cores.

Coil 10, as shown in FIG. 2, includes split capacitor balun circuits 18, 20, comprising capacitors 22, 24 and 26 in loop 12, and capacitors 28, 30 and 32 in loop 14, to convert the balanced loop signal to an unbalanced output signal.

The coaxial cable connected to the coil output is unbalanced in nature.

The values of capacitors 22, 24 and 26 in balun 18, and capacitors 28, 30 and 32 in balun 20, are carefully chosen in such a way as to cause capacitor 26 in balun 18 and capacitor 28 in balun 20 to precisely equal that of the combination of capacitors 22 and 24 in balun 18 and capacitors 30 and 32 in balun 20, including the effect that the 50 ohm impedance coaxial cables on the outputs have on capacitors 24 and 30.

Since the effective capacitance of capacitors 22 and 24 in balun 18, and capacitors 30 and 32 in balun 20 precisely equals that the capacitor 26 in balun 18 and capacitor 28 in balun 20, their junction will be precisely at ground potential. Therefore, this junction is connected to the shield of the coaxial cable at the coil output.

The net effect of baluns 18, 20 is that minimal signal power will be radiated from the coaxial shield.

Figure 4A:
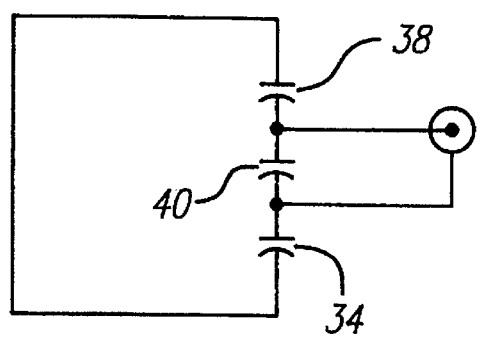
FIG. 4 is a circuit diagram of alternate balun circuits in a coil pursuant to the invention.
Figure 4B:
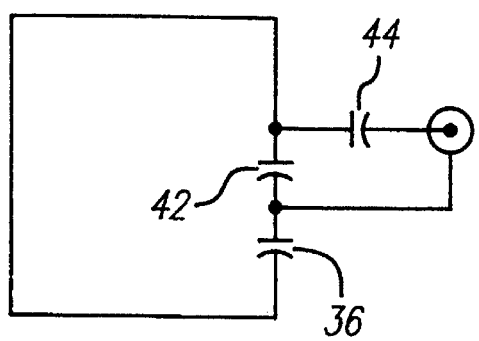

Variations of the split-capacitor balun of the invention are shown in FIG. 4, with capacitors 34, 36 selected to substantially equal the combinations of capacitors 38, 40 and 42, 44 respectively, including the effect of the coaxial cable impedances on capacitors 40 and 42.

A coil 10, such as a linear or other coil, in another embodiment of the invention, is more symmetrical during both the receive and transmit phases of the imaging cycle, so as to prevent undesirable inhomogeneities in the magnetic resonance image.

It includes a capacitor and decoupling circuit opposite that of the primary tuning and decoupling circuits, for increased symmetry during the imaging cycle receive and transmit phases.

Primary and secondary decoupling circuits 46, 48 in loop 12, and 50, 52 in loop 14, comprise capacitors 54 and 56, and inductors 58 and 60 in loop 12, and capacitors 62, 64 and inductors 66, 68 in loop 14.

To keep the loop symmetrical during the reception phase, capacitor 78 in loop 12, and capacitor 80 in loop 14, are chosen to be equal to the total equivalent capacitance of capacitors 22, 24 and 26 in loop 12, and capacitors 28, 30 and 32 in loop 14 respectively, including the effect of the coaxial cable impedances on capacitors 24 and 30.

Diode networks 70 and 72 in loop 12, and 74 and 76 in loop 14, are substantially open circuited during the reception phase of the magnetic resonance imaging cycle, virtually eliminating any effect of the decoupling components during the reception phase.

During the transmission phase, diode networks 70 and 72 in loop 12, and 74 and 76 in loop 14, are short circuited, thereby enabling the decoupling circuits 46 and 48 in loop 12, and decoupling circuits 50 and 52 in loop 14.

The two decoupling circuits 46 and 48 on opposite sides of loop 12, and two decoupling circuits 50 and 52 on opposite sides of loop 14, enable loops 12 and 14 to maintain symmetry during the transmission phase.

A coil 10, such as a linear or other coil, in another embodiment of the invention, increases the power handling capacity of fast diodes used in a decoupling circuit, for effective passive decoupling which reduces the risk to the patient over active decoupling.

It includes multiple diodes and current stabilizing impedances in parallel to effectively multiply the power handling capability of fast PIN diodes. Alternatively it includes a back-to-back combination of a fast low-power diode and a slow high-power PIN diode having a large intrinsic region to effectively multiply the power handling capability of the fast diode.

Figure 3:
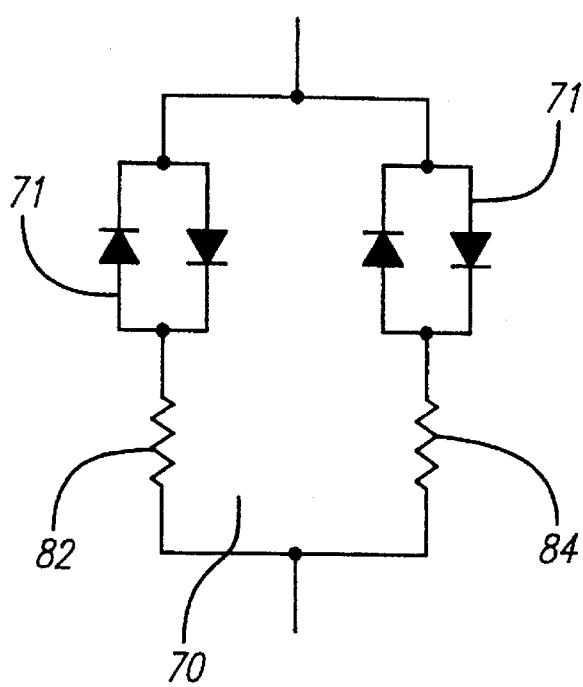
FIG. 3 is a circuit diagram of a diode network in a coil pursuant to the invention.

Diode networks 70 and 72 in loop 12, each consist of a plurality of back-to-back diodes 71, 71 connected in parallel, as shown in FIG. 3. The diodes may comprise PIN diodes which have an intrinsic layer sufficiently small to keep the turn on voltage to a minimum, and sufficiently large that the diodes are capable of withstanding large power dissipations. It may also alternatively include a PIN diode and a detector diode.

For typical surface coils, the required power dissipation of the diodes will surpass that of a single diode pair, thereby requiring a plurality of pairs in parallel.

Since diode voltage drops vary from diode to diode, and since diodes have a negative temperature coefficient, in that the voltage drop increases as the junction temperature increases, diodes connected in parallel are prone to diverting current from one diode to another, resulting in thermal run-away and eventual diode failure.

Stabilizing impedances, as 82 and 84 in FIG. 3, operate to keep the current flow divided evenly among diode pairs in a diode network, as 70 in FIG. 2. Components 82 and 84 may consist of any impedive device such as resistors, inductors, capacitors, non-linear devices, or any combination thereof, or a small loop of wire or curved and/or narrow circuit board trace, which are implementations of an inductor.

Another example of an implementation of stabilizing impedances 82 and 84 is an axial lead resistor mounted vertically on a circuit board, with the bend in the resistor's lead constituting a small inductance in series with the resistance.

While FIG. 3 shows one impedive element per pair of back-to-back diodes, an alternative would be to provide a separate impedive element for each diode. While separate elements would require more circuitry, they would allow the use of impedive elements having a lower power handling capability.

An alternate diode network, not shown in FIG. 3, having the properties essential to passive decoupling applications, consists of a back-to-back diode pair, where one diode is a high-speed, low power radio frequency diode, and the other is a low-speed, high power PIN diode having a large intrinsic region.

The high-power PIN diode works in a manner similar to the way it works in an active decoupling circuit, using a small direct current bias current to control the larger radio frequency current. The high-speed diode is needed to keep the radio frequency alternating current from discharging the PIN diode's intrinsic region, essentially acting as a detector, providing the small direct current bias. Alternatively, one of the diodes may comprise a detector diode.

A coil 10, such as a linear or other coil, in another embodiment of the invention, cancels the effects of radiation of energy from the large level of radio frequency current flowing through the decoupling circuit otherwise absorbed by the patient's tissue, which would lower the quality factor of the decoupling circuit and result in undesirable image artifacts.

It includes a counter-rotating decoupler circuit to cancel the effects of radiation, and may further include a Faraday shield to prevent radiation from the decoupling circuit.

Capacitor 54 is selected to be as close in value to capacitor 26 as possible, in loop 12. The addition of capacitor 54 sets up a second loop of radio frequency current that flows opposite in direction from the current through capacitor 26.

With the capacitances of capacitors 54 and 26 exactly equal, the radiated magnetic fields from the counter-rotating decoupling circuit nearly cancel at distances not too far from the circuit, resulting in a higher Q circuit, thereby maximizing decoupling effectiveness. These conditions will also reduce image artifacts that would have resulted from radio frequency energy radiated from a single loop and absorbed by the patient's tissue.

Another method for accomplishing the results of maximizing decoupling effectiveness and reducing image artifacts is to position a Faraday shield between the decoupling circuit and the patient.

A combination of counter-rotating circuit elements and a Faraday shield further provides effective decoupling and image artifact reduction.

Figure 5:
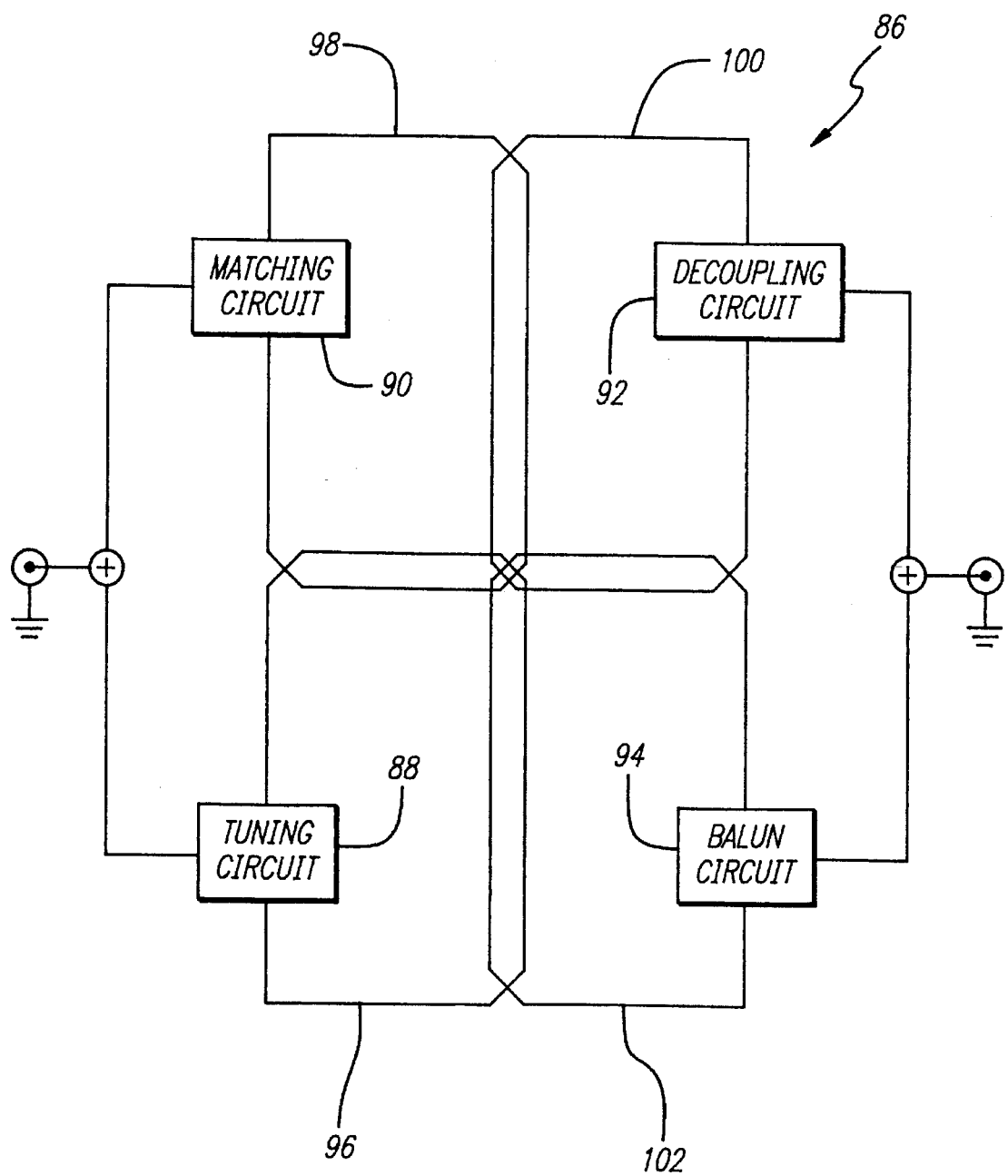
FIG. 5 is a circuit diagram of an array of loops in a coil pursuant to the invention.

A coil 86, as shown in FIG. 5 in another embodiment of the invention, provides an array of loops for effective signal-to-noise ratio and sufficient coverage for imaging a region of interest larger then the optimal loop size.

It includes an array of two or more loops, linear or quadrature, without any additional hardware or software to reconstruct the image, for effective signal-to-noise ratio and sufficient imaging coverage.

Coil 86, for improving the signal-to-noise ratio of a coil that is required to provide coverage of a region-of-interest greater than an optimal loop size, employs overlapping loops, as, for example, where the desired coverage of the region of interest is twice as long as the optimal loop size. In FIG. 5, the blocks 88, 90, 92 and 94 represent the tuning, matching, decoupling and balun circuits.

The coil may alternatively comprise butterfly or simple loops. Further, alternatively, the number of loops in the array may be increased as required to cover the entire region of interest.

The oversized coil 86 is divided into loops 96, 98, 100 and 102 of optimal size. The outputs of loops 96, 98, 100 and 102 are then added with a summing device such as a hybrid coupler, or another passive or active device.

For a coil which doubles the effective coil area, the loss of signal-to-noise ratio is on the order of three decibels rather than a nearly six decibel-loss which would result from use of one oversized loop, and would depend upon the particular loop configuration and source of noise.

For the coil 86 shown in FIG. 5, the area of coverage is quadrupled, in that four overlapping loops are employed. For quadrature coils, the quadrature coupling may be performed either before or after the summation of signals from the divided oversized loop, resulting in achieving the same increase in performance.

In another variation of the loop-array configuration, a phase reversal of one or more of the loops in the array is particularly effective when the array consists of two loops, with the phase of one of the loops reversed, and with one of the loops placed on one side of the region-of-interest being imaged, and the other loop on the other side.

For signal, this variation is identical to a butterfly loop wrapped around the region of interest. However, less noise will be introduced with this variation, thereby providing a greater signal-to-noise ratio.

The phase reversal may be effected by any of several techniques, including the use of a one-hundred-eighty degree hybrid coupler, a passive or active subtracting device, or by reversing the loop leads.

In a further variation of the quadrature loop array configuration of FIG. 5, any or all of the summing elements, linear or quadrature, may be removed, and the additional coil outputs connected to separate signal processors for simultaneous acquisition. This will provide substantial gains in signal-to-noise ratio.

Each loop 96, 98, 100 and 102 in the quadrature surface coil 86 shown in FIG. 5 includes an area of overlap with each of its adjacent loops. The degree of overlap is adapted to be calibrated so as to minimize the inductive coupling between adjacent loops.

Preferred embodiments of the invention have been set forth above, for the purpose of explaining the invention. However, it is to be understood that variations in such embodiments may be within the scope and spirit of the invention as set forth in the claims.

I claim:

1. A surface coil, for imaging a local region of interest, for use with a volume coil adapted to transmit radio frequency pulses in a magnetic resonance imaging system, which surface coil is adapted to be open circuited for passively decoupling the surface coil from the volume coil when the volume coil is transmitting radio frequency pulses, which passive decoupling is generated by current induced in the surface coil by the volume coil radio frequency pulses, further adapted to increase the current handling capacity of the surface coil during volume coil radio frequency pulse transmission for passive decoupling, comprising:

(a) means for imaging the local region of interest;

(b) means for passively decoupling the imaging means, connected to the imaging means, for open circuiting the imaging means to passively decouple the surface coil from the volume coil when the volume coil is transmitting radio frequency pulses, which passive decoupling is generated by current induced in the surface coil by the volume coil radio frequency pulses, which decoupling means have a capacity for handling the current, and comprise a plurality of diode arrays connected in parallel, each comprising back to back diodes connected in parallel; and (c) means for increasing the current handling capacity of the decoupling means during volume coil radio frequency pulse transmission for passive decoupling, connected to the decoupling means, comprising a plurality of current stabilizing impedances.

2. A coil as in claim 1, in which the decoupling means comprise a PIN diode and a detector diode.

3. A coil as in claim 1, in which each of the plurality of current stabilizing impedances is connected in series with one of the plurality of diode arrays.

4. A coil as in claim 1, in which the plurality of current stabilizing impedances comprise a plurality of current stabilizing resistances.

5. A coil as in claim 1, in which the plurality of current stabilizing impedances comprise means for dropping the voltage.

6. A coil as in claim 1, in which each of the current stabilizing impedances is connected in series with one of the diodes in one of the plurality of diode arrays.

7. A coil as in claim 1, in which the plurality of current stabilizing impedances are adapted to divide the current flow substantially equally among the plurality of diode arrays.

8. A coil as in claim 1, in which the decoupling means comprise a plurality of fast PIN diodes.

9. A coil as in claim 1, in which the decoupling means comprise a fast low-power PIN diode and a slow high-power PIN diode.

10. A coil as in claim 1, in which the plurality of current stabilizing impedances comprise a plurality of resistors.

11. A coil as in claim 2, in which each of the plurality of current stabilizing impedances is connected in series with one of the plurality of diode arrays.

12. A coil as in claim 2, in which the plurality of current stabilizing impedances comprise a plurality of resistors.

13. A coil as in claim 8, in which each of the plurality of current stabilizing impedances is connected in series to one of the plurality of fast PIN diodes.

14. A coil as in claim 8, in which the plurality of current stabilizing impedances comprise a plurality of resistors.

15. A coil as in claim 8, in which each of the plurality of current stabilizing impedances is connected in series to one of the fast low-power PIN and slow high-power PIN diodes.

16. A coil as in claim 9, in which the plurality of current stabilizing impedances comprise a plurality of resistors.

17. A surface coil, for imaging a local region of interest, for use with a volume coil adapted to transmit radio frequency pulses in a magnetic resonance imaging system, which surface coil is adapted to be open circuited for passively decoupling the surface coil from the volume coil when the volume coil is transmitting radio frequency pulses, which passive decoupling is generated by current induced in the surface coil by the volume coil radio frequency pulses, further adapted to increase the current handling capacity of the surface coil during volume coil radio frequency pulse transmission for passive decoupling, comprising:

(a) means for imaging the local region of interest;

(b) means for passively decoupling the imaging means, connected to the imaging means, for open circuiting the imaging means to passively decouple the surface coil from the volume coil when the volume coil is transmitting radio frequency pulses, which passive decoupling is generated by current induced in the surface coil by the volume coil radio frequency pulses, which decoupling means have a capacity for handling the current, and comprise a plurality of diode arrays connected in parallel, each comprising a PIN diode and a detector diode; and (c) means for increasing the current handling capacity of the decoupling means during volume coil radio frequency pulse transmission for passive decoupling, connected to the decoupling means, comprising a plurality of current stabilizing impedances.

18. A coil as in claim 17, in which each of the plurality of current stabilizing impedances is connected in series with one of the plurality of diode arrays.

19. A coil as in claim 17, in which the plurality of current stabilizing impedances comprise a plurality of resistors.

* * * * *